US007079419B2

(12) United States Patent
Roohparvar

(10) Patent No.: US 7,079,419 B2
(45) Date of Patent: *Jul. 18, 2006

(54) NAND FLASH MEMORY WITH READ AND VERIFICATION FOR THRESHOLD UNIFORMITY

(75) Inventor: Frankie F. Roohparvar, Milpitas, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/122,708

(22) Filed: May 5, 2005

(65) Prior Publication Data

US 2005/0195651 A1    Sep. 8, 2005

Related U.S. Application Data

(63) Continuation of application No. 10/431,862, filed on May 8, 2003, now Pat. No. 6,975,542.

(51) Int. Cl.
*G11C 16/06* (2006.01)
*G11C 16/04* (2006.01)

(52) U.S. Cl. .................... 365/185.22; 365/185.17; 365/185.24; 365/185.33

(58) Field of Classification Search .............. None
See application file for complete search history.

(56) References Cited

U.S. PATENT DOCUMENTS

| 5,175,704 | A | * | 12/1992 | Minagawa et al. ..... 365/185.05 |
| 5,422,845 | A | * | 6/1995 | Ong ....................... 365/185.18 |
| 5,673,223 | A | | 9/1997 | Park |
| 6,021,083 | A | | 2/2000 | Shiau et al. |
| 6,049,498 | A | | 4/2000 | Chen |
| 6,370,062 | B1 | | 4/2002 | Choi |
| 6,493,276 | B1 | | 12/2002 | Lin et al. |
| 6,975,542 | B1 | * | 12/2005 | Roohparvar ........... 365/185.22 |
| 2002/0159315 | A1 | | 10/2002 | Noguchi et al. |

* cited by examiner

*Primary Examiner*—Son Mai
(74) *Attorney, Agent, or Firm*—Leffert Jay & Polglaze, PA

(57) ABSTRACT

A plurality of cells in a flash memory device are coupled together in a series configuration, as in a NAND flash memory. A position of a first accessed cell is determined with reference to a ground potential in the flash memory device. A first word line signal is coupled to the first accessed cell. The first word line signal voltage level is adjusted in response to the position of the first accessed cell in its series of cells.

22 Claims, 5 Drawing Sheets

NAND FLASH MEMORY WITH READ AND VERIFICATION FOR THRESHOLD UNIFORMITY

RELATED APPLICATIONS

This application is a continuation of U.S. patent application Ser. No. 10/431,862, filed May 8, 2003 now U.S. Pat. No. 6,975,542 and titled, NAND FLASH MEMORY WITH IMPROVED READ AND VERIFICATION THRESHOLD UNIFORMITY, each of which is commonly assigned and incorporated by reference herein in their entirety.

TECHNICAL FIELD OF THE INVENTION

The present invention relates generally to memory devices and in particular the invention relates to read and verification thresholds in a flash memory device.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices. Most electronic devices are designed with a single flash memory device.

NAND flash memory devices are becoming popular due to the high memory densities possible at a relatively low cost. The NAND architecture connects 8, 16 or 32 memory cells in series on a single bit line. A simplified diagram of a typical prior art NAND architecture flash memory is illustrated in FIG. 1.

In FIG. 1, a NAND flash array is comprised of an array of floating gate cells 101 arranged in series strings 104, 105. Each of the floating gate cells are coupled drain to source in the series chain 104, 105. Word lines (WL0–WL31) that span across multiple series strings 104, 105 are coupled to the control gates of every floating gate cell in order to control their operation.

In operation, the word lines (WL0–WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1–BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

It can be seen from FIG. 1 that in order to read one memory cell, current must flow through the other memory cells in the series 104, 105. Therefore, the remaining cells become parasitic resistances in series with either the drain or source connections. Since the cell 123 at the bottom of the series 104 is closest to the array ground, it sees 31 voltage drops in the drain line and one in the source line. The cell 120 at the top of the series 104 sees 31 voltage drops in the source line and one in the drain line.

It is well known in the art that the current of any transistor (i.e., memory cell) is determined by the transistor's Vgs and Vds, depending on the mode of operation. In saturation mode, the current of the cell varies mostly with Vgs and is not a function of Vds. The transistor current varies with the square of Vgs. In linear mode, the current through the cell varies with Vds.

Assuming a particular cell is operating in saturation mode in order to get the highest gain, it can be seen that the cell 123 at the bottom of the series of cells 104 does not experience a voltage drop on its Vgs. The cell 120 at the top of the series of cells 104 sees 31 times the voltage drop in the source voltage. Since the cell current is a function of (Vgs–Vt)2, the difference in the source voltages is going to be squared in reflection of the cell current change, Vt (i.e., the threshold voltage) being the same. This eventually may result in the bottom cell 123 being over-erased due to the top cell 120 dictating the number of erase pulses.

Typical flash memory uses a single bit-per-cell. Each cell is characterized by a specific threshold voltage or Vt level. Within each cell, two possible voltage levels exist. These two levels are controlled by the amount of charge that is programmed or stored on the floating gate; if the amount of charge on the floating gate is above a certain reference level, the cell is considered to be in a different state (e.g., programmed or erased).

Multilevel cells have recently been introduced to greatly increase the density of a flash memory device. This technology enables storage of multiple bits per memory cell by charging the floating gate of the transistor to different levels. This technology takes advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage ranges of 200 mV for each range. Typically, a dead space or guard band of 0.2V to 0.4V is between each range. If the voltage stored on the cell is within the first range, the cell is storing a 00. If the voltage is within the second range, the cell is storing a 01. This continues for as many ranges are used for the cell.

The precision at which the voltages in multilevel cells on the device are sensed must greatly increase from a normal two state cell. The multiple thresholds assigned to a cell require the cells to be more uniform in their threshold and Vt distribution as well as the uniformity in the cell currents.

For the reasons stated above, and for other reasons stated below which will become apparent to those skilled in the art upon reading and understanding the present specification, there is a need in the art for a flash memory having uniform threshold voltage and Vt distribution.

SUMMARY

The above-mentioned problems with uniform threshold distribution and other problems are addressed by the present invention and will be understood by reading and studying the following specification.

The various embodiments relate to a flash memory with an improved read and erase verification threshold uniformity. A method for improving the uniformity comprises determining a position of a first accessed cell, of a plurality of cells in a series configuration. The position is determined with reference to a ground potential in the flash memory device. A first word line signal voltage level is adjusted in response to the position of the first accessed cell. The first word line signal is coupled to the first accessed cell.

Another embodiment of the present invention generates a reference measurement for each cell. The measured value of an access cell is then compared with its new reference measurement to determine the value of that particular cell.

Further embodiments of the invention include methods and apparatus of varying scope.

DETAILED DESCRIPTION

Figure 1:
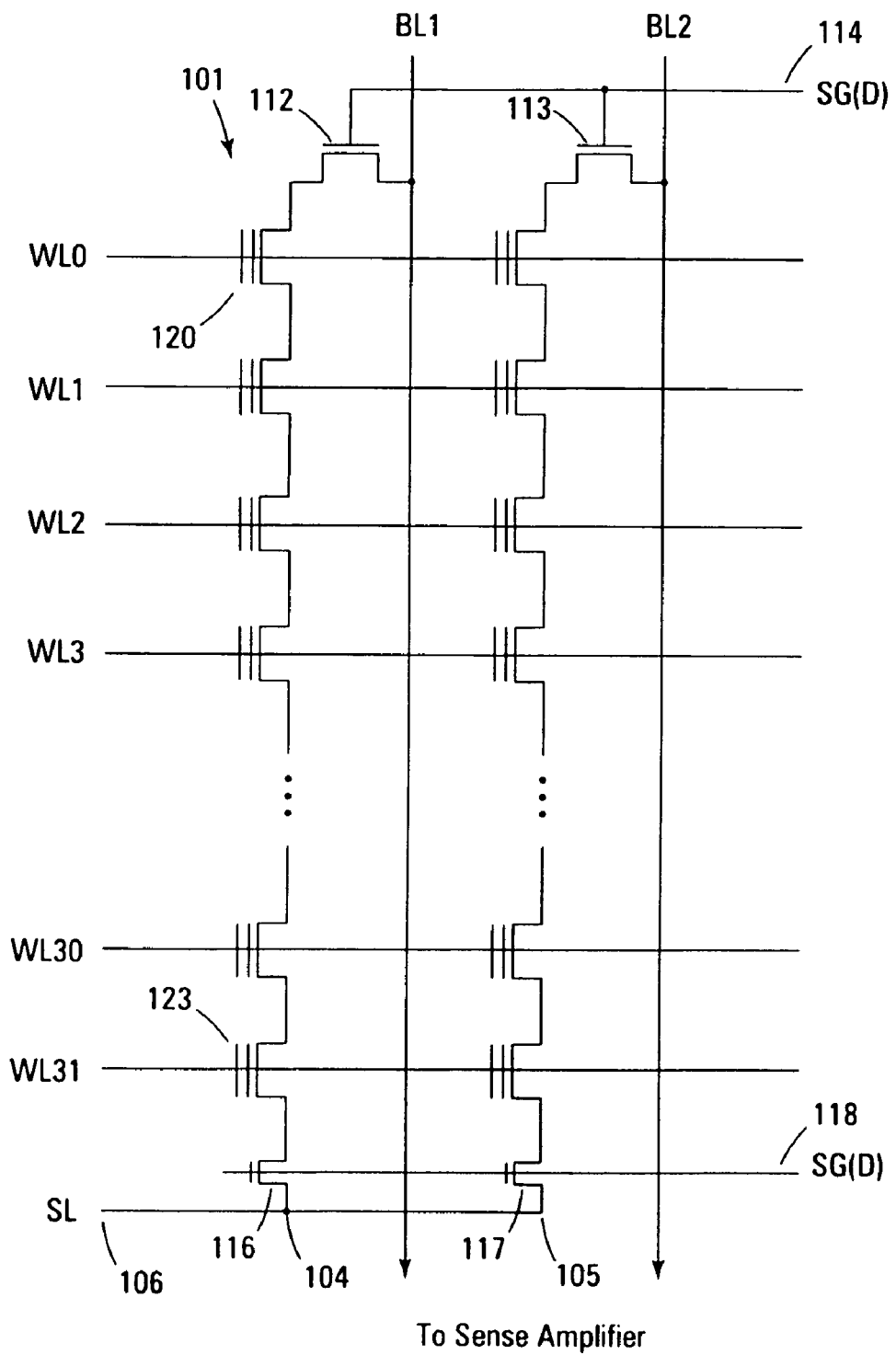
FIG. 1 shows a simplified diagram of a typical prior art flash memory array.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
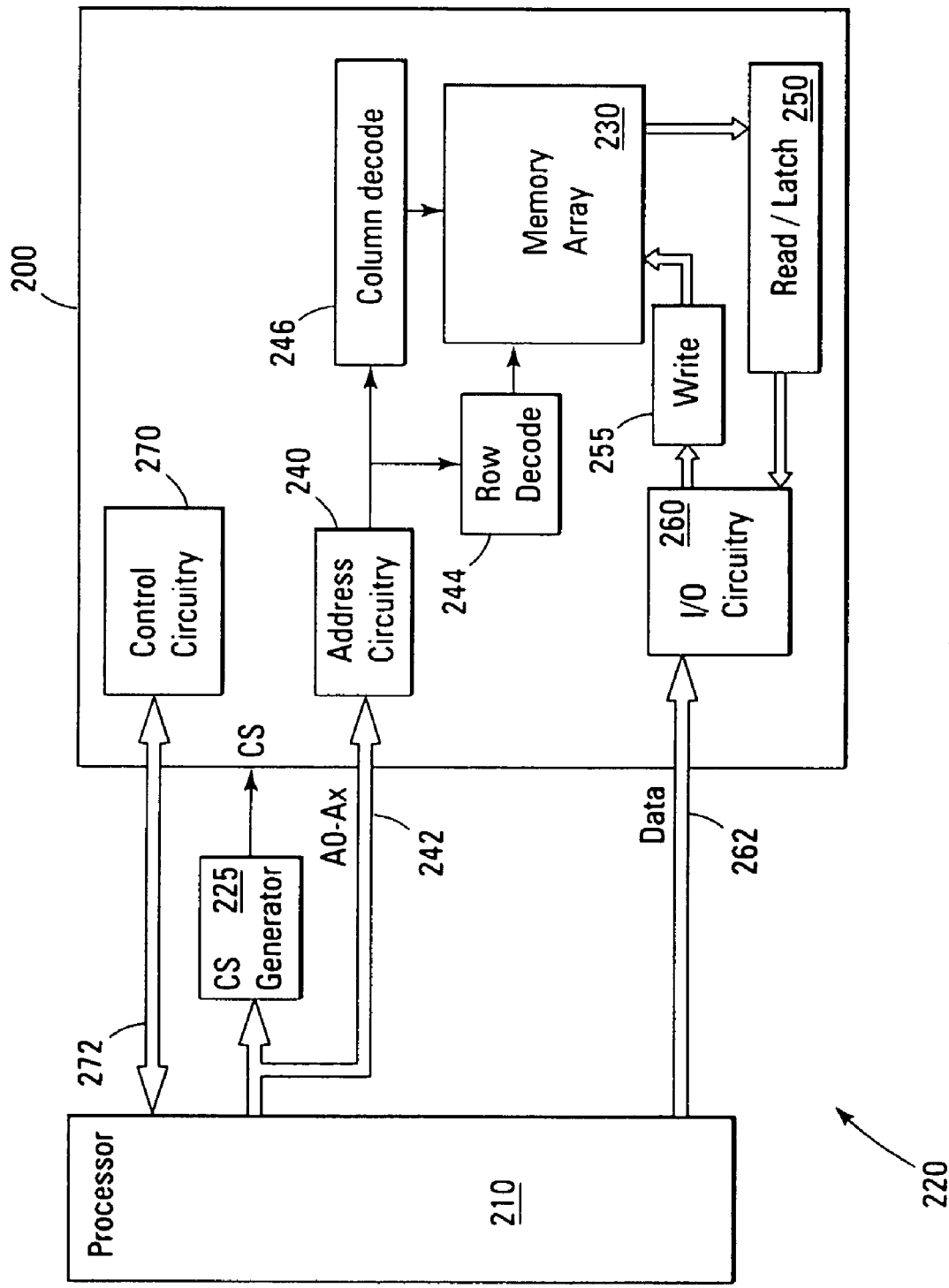
FIG. 2 shows a block diagram of one embodiment of a memory system of the present invention.

FIG. 2 illustrates a functional block diagram of a memory device 200 of one embodiment of the present invention that is coupled to a controller circuit 210. The controller circuit 210 may be a microprocessor, a processor, or some other type of controlling circuitry. The memory device 200 and the controller 210 form part of an electronic system 220. The memory device 200 has been simplified to focus on features of the memory that are helpful in understanding the present invention.

The memory device includes an array of memory cells 230. The memory cells are non-volatile floating-gate memory cells and the memory array 230 is arranged in banks of rows and columns.

An address buffer circuit 240 is provided to latch address signals provided on address input connections A0–Ax 242. Address signals are received and decoded by a row decoder 244 and a column decoder 246 to access the memory array 230. It will be appreciated by those skilled in the art, with the benefit of the present description, that the number of address input connections depends on the density and architecture of the memory array 230. That is, the number of addresses increases with both increased memory cell counts and increased bank and block counts.

The memory device 200 reads data in the memory array 230 by sensing voltage or current changes in the memory array columns using sense/latch circuitry 250. The sense/latch circuitry, in one embodiment, is coupled to read and latch a row of data from the memory array 230. Data input and output buffer circuitry 260 is included for bi-directional data communication over a plurality of data connections 262 with the controller 210). Write circuitry 255 is provided to write data to the memory array.

Control circuitry 270 decodes signals provided on control connections 272 from the processor 210. These signals are used to control the operations on the memory array 230, including data read, data write, and erase operations. In one embodiment, the control circuitry 270 executes the methods of the present invention.

Chip select generation circuitry 225 generates the chip select signals for the memory device 200. This circuitry 225 uses the address connections 242 from the controller 210 to generate the appropriate chip select signal depending on the address present on the address connections 242.

The flash memory device illustrated in FIG. 2 has been simplified to facilitate a basic understanding of the features of the memory. A more detailed understanding of internal circuitry and functions of flash memories are known to those skilled in the art.

Figure 3:
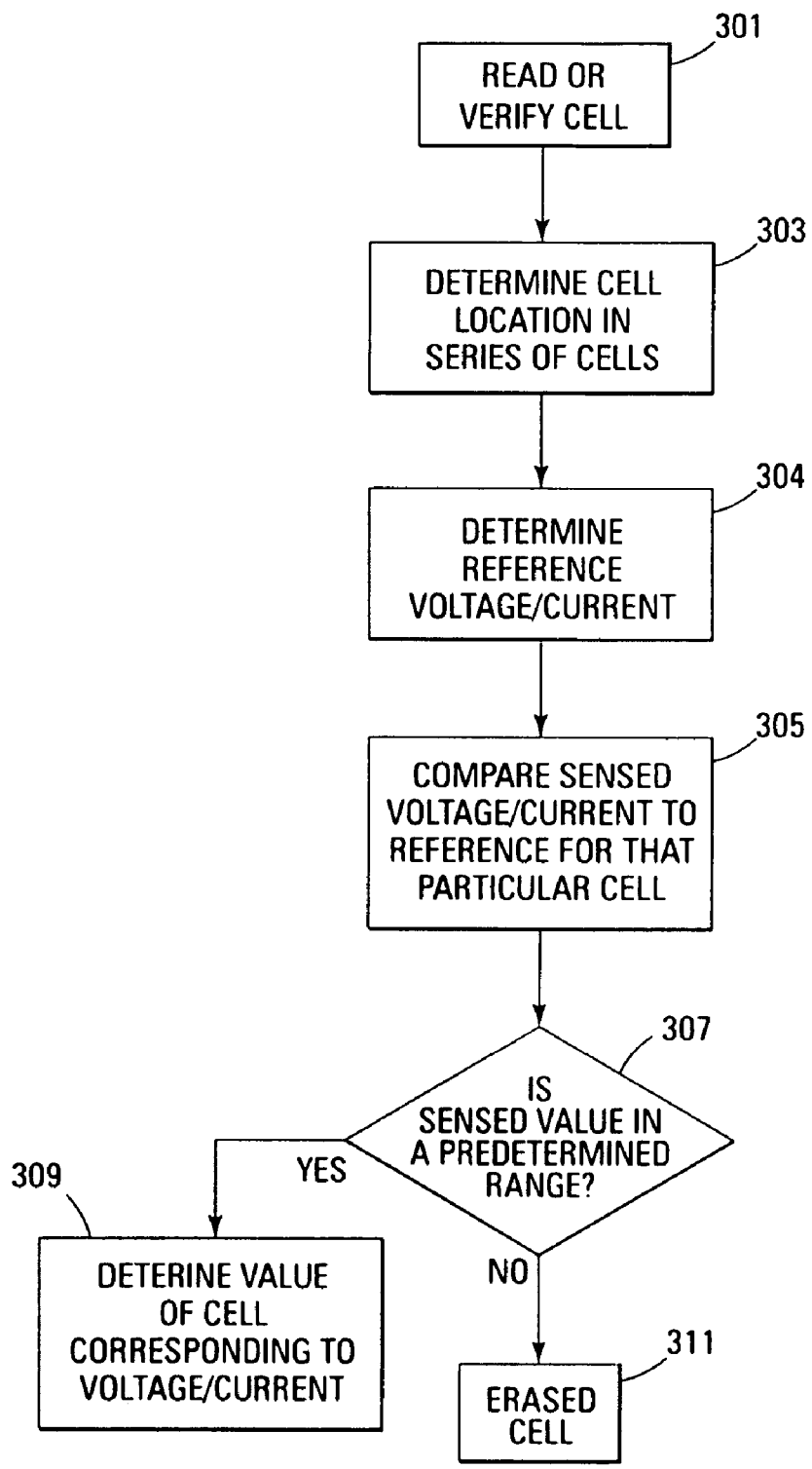
FIG. 3 shows a flowchart of one embodiment of a method of the present invention for improving read and erase verification uniformity.

FIG. 3 illustrates a flowchart of one embodiment of a method of the present invention for improving read and erase verification uniformity. This method may be executed by the flash memory device controller and, in one embodiment, the instructions are stored in a volatile or non-volatile memory area of the device.

The desired memory cell is read or verified 301 to determine its state. As is well known in the art, the reading of a cell is performed by writing the cell address to the X and Y decoders. The decoders generate the appropriate word line and bit line signals for that particular cell. The sense amplifier coupled to that cell is then read to determine the voltage or current, depending on the embodiment, generated by that cell. Verification is substantially the same process but is performed to determine the success or failure of an erase operation of that cell. The reading and verification operations are well known in the art and are not discussed further.

The cell location in relation to the other cells in the series of cells is then determined 303. This may be accomplished by a look-up table stored in non-volatile memory that lists an address and its corresponding cell location (i.e., how many voltage drops are between it and ground). This information is then used to determine a reference voltage/current for that particular cell 304.

The reference voltage/current information for a particular cell is going to be different depending on its location in the series of cells of one bit line. This concept was discussed previously in greater detail. The different reference voltages/currents, in one embodiment, are determined by experimentation prior to manufacture of the memory device and are stored in non-volatile memory with the look-up table. In such an embodiment, the reference voltage/current is accessed at substantially the same time that the cell is addressed. Alternate embodiments dynamically generate the reference voltage/current for each accessed cell using extra circuitry in the sense amplifier and memory array.

In an alternate embodiment that employs multilevel cells, multiple reference voltages/currents may be generated for each cell in response to the cell's position in the series of cells. Since multilevel cells require multiple thresholds to determine the stored bit pattern, each threshold of the present invention should be updated in response to the position of the cell. In still another embodiment, an offset for each particular cell can be generated and used to generate the different thresholds necessary for the operation of a multi-level cell.

Once the voltage/current reference(s) for a particular cell is determined 304, the measured voltage/current for that cell is compared to the reference(s) to determine the state of the cell 305. If the measured voltage/current is within one of the ranges for the cell 307, the range in which the measured voltage/current exists 309 indicates the cell's stored value. If the measured value is not within one of the predetermined ranges 307, the cell is in an erased state 311.

Figure 4:
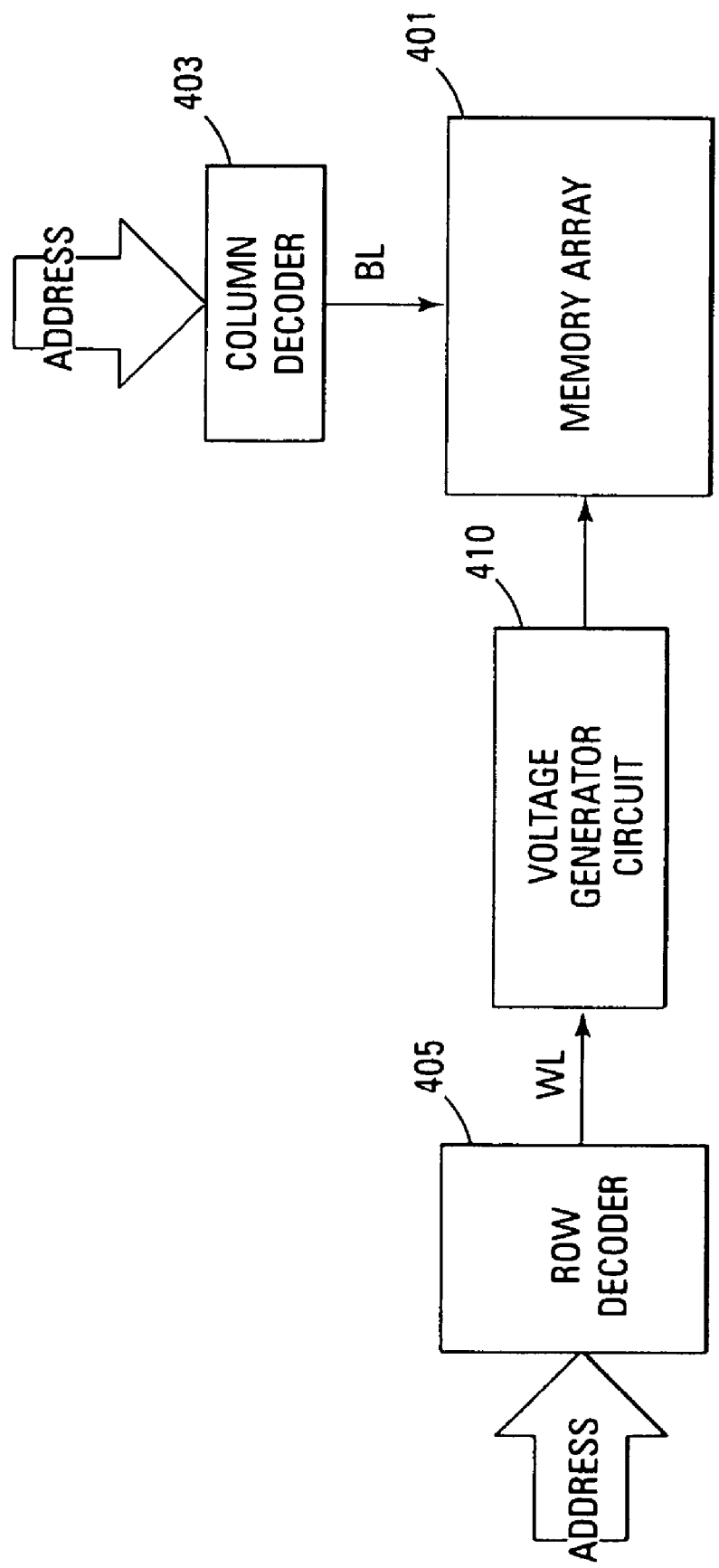
FIG. 4 shows a block diagram of an alternate embodiment of a memory device of the present invention that improves read and erase verification uniformity.

FIG. 4 illustrates a block diagram of an alternate embodiment of a memory device of the present invention that improves read and erase verification uniformity. This embodiment changes the voltage applied to each word line to compensate for the cell's location in the series of cells.

For example, a voltage of 4.5V during the read of the bottom cell in the series of cells would be converted to higher voltages for each cell in the series; the closer the cell is to the top of the series, the larger the voltage. The value of the higher voltage for each cell varies with the quantity of cells between the top and the bottom cells. A larger quantity of cells in the series requires a larger voltage for the top cell due to the larger quantity of voltage drops in the series.

In this embodiment, while the source voltage has risen on the top cell, so would its gate voltage. The Vgs would remain constant. The Vt and Vgs of the top cell are matched and, for a given erase pulse, all cells are then erased uniformly and behave with the same current for reading and erase verification. The voltage of the gate is a controlled voltage that is generated internally.

Referring to FIG. 4, a memory array 401 is comprised of a typical NAND architecture array of memory cells. A column decoder 403 generates the bit line signals in response to an address input. The bit line signals are applied to the memory array 401. The operation of the column decoder 403 in generating the bit line signals is well known in the art and is not discussed further.

A row decoder 405 generates the word line signals in response to the address input. The operation of the row decoder 405 in generating the word line signals is well known in the art and is not discussed further. The word line signals at a nominal voltage level are applied to a voltage generator circuit 410. The voltage generator circuit 410 is responsible for generating the proper voltage to be applied to each cell depending on its location in the series of cells. The nominal voltage level for the word line signals depends on the embodiment of the flash memory device. In one embodiment, the nominal word line voltage is 4.50V. The present invention, however, is not limited to any one nominal word line voltage level.

In operation, when the voltage generator circuit 410 receives a word line signal from the row decoder 405 indicating that the cell closest to ground is to be read or verified, the voltage generator 410 does not increase the voltage applied to that particular word line input to the memory array 401. If the voltage generator circuit 410 receives a word line signal indicating that the next cell up from the cell closest to ground is to be read or verified, the voltage generator circuit 410 increases the word line voltage to the memory array 401 by an additional 0.01V. Similarly, as the word line signals are received indicating a read or verification in increasing distance from the cell closest to ground, the word line voltage is increased 0.01V for each cell.

As indicated above, the voltage level that the word line voltage is increased is different for alternate embodiments. The present invention is not limited to any one voltage increase per cell.

In one embodiment, the voltage generator circuit 410 is comprised of a larger reference voltage that is divided down by a voltage divider circuit, depending on the particular word line signal that is received. In another embodiment, a digital-to-analog converter converts the input word line signals to an analog voltage based on the received address. The present invention is not limited to any one method for generating the memory line voltage to the memory array 401.

Figure 5:
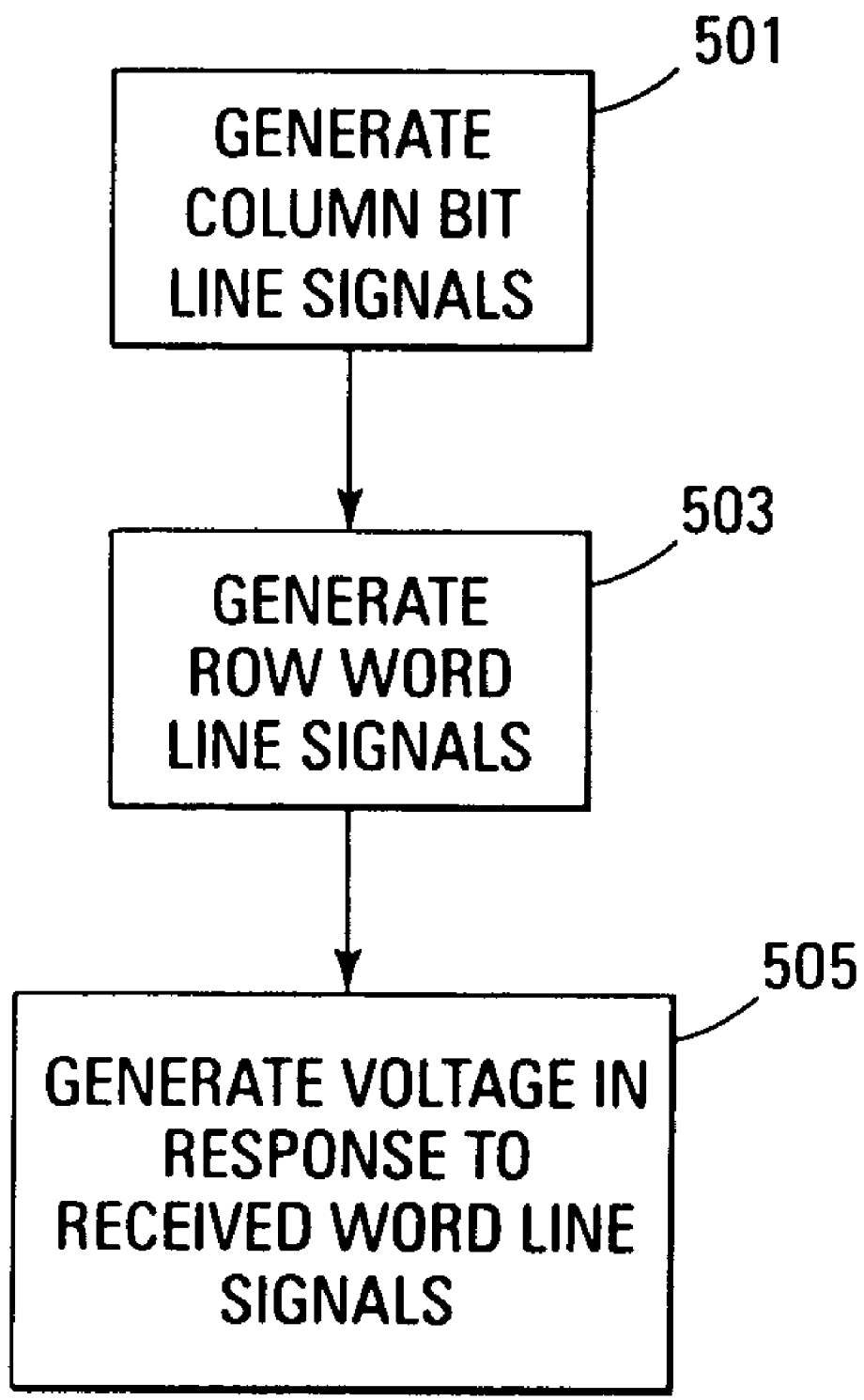
FIG. 5 shows a flowchart of one embodiment of a method for improving the read and erase verification uniformity in accordance with the embodiment of FIG. 4.

FIG. 5 illustrates a flowchart of the method of the present invention in accordance with the embodiment of FIG. 4. In this embodiment, the column decoder generates the bit line signals 501 and the row decoder generates the word line signals 503. The voltage generator circuit receives the word line signals from the row decoder and generates the proper voltage to be applied to the desired cell 505 in response to the location of the cell in the series of cells.

CONCLUSION

The embodiments of the flash memory device of the present invention increase the uniformity of the threshold distribution of cells for read and erase verification. This is accomplished by basing either the reference voltage/current or the word line voltage on the cell's location in the series of cells on each bit line.

While the flash memory device described above is in reference to a NAND-type flash memory device, the present invention is not limited to any one type of flash memory device. Other types of flash memory devices include NOR-type flash memory devices and synchronous flash memory devices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A flash memory device comprising:
    a memory array comprising a plurality of memory cells coupled together in a series configuration, a first end of the series configuration coupled to a bit line and a second end of the series configuration coupled to a ground potential reference; and
    controller circuitry, coupled to the memory array, for controlling operation of the device, the controller circuitry adapted to execute a method for increasing read and erase verification threshold uniformity comprising determining a position, with reference to a ground potential, of a first accessed cell in the series configuration and adjusting a first word line signal voltage level, coupled to the first accessed cell, in response to the position of the first accessed cell.

2. The device of claim 1 wherein the controller circuitry generates a second word line voltage to a second accessed cell such that the second word line voltage is greater than the first word line voltage when the second accessed cell's position is further from the ground potential in the series configuration than the first accessed cell's position.

3. The device of claim 1 wherein the controller circuitry generates a second word line voltage to a second accessed cell such that the second word line voltage is less than the first word line voltage when the second accessed cell's position is closer to the ground potential in the series configuration than the first accessed cell's position.

4. The device of claim 1 wherein the flash memory device is comprised of a NAND architecture.

5. The device of claim 1 wherein the controller circuitry determines the position of the first accessed cell by decoding an address input to the flash memory device.

6. The device of claim 1 wherein the control circuitry adjusts the first word line voltage by:
   decoding an input address to generate the first word line signal having a nominal voltage level; and
   compensating the nominal voltage level in response to the position of the first accessed cell.

7. The device of claim 6 wherein the control circuitry compensates the nominal voltage level by coupling the first word line signal having the nominal voltage level to a resistor divider voltage generator circuit.

8. The device of claim 6 wherein the control circuitry compensates the nominal voltage level by coupling the first word line signal having the nominal voltage level to an analog to digital converter acting as a voltage generator circuit.

9. A NAND flash memory device comprising:
   a memory array comprising a plurality of memory cells coupled together in a series configuration, a first end of the series configuration coupled to a bit line and a second end of the series configuration coupled to a ground potential reference; and
   control circuitry, coupled to the memory array, the control circuitry adapted to execute methods for controlling operation of the memory device including determining a position, with reference to a ground potential, of a first accessed cell of the plurality of memory cells, generating a word line signal having a first voltage level in response to an address input, and compensating the first voltage level in response to the position of the first accessed cell.

10. The device of claim 9 wherein the control circuitry compensates the first voltage level by increasing the first voltage level in response to the position of the first accessed cell being further from the ground potential.

11. The device of claim 9 wherein the control circuitry compensates the first voltage level by adjusting the first voltage level towards a nominal voltage level in response to the position of the first accessed cell being closer to the ground potential.

12. An electronic system comprising:
   a processor that generates memory signals; and
   a flash memory device, coupled to the processor, that operates in response to the memory signals, the device comprising:
      a memory array comprising a plurality of memory cells coupled together in a series configuration, a first end of the series configuration coupled to a bit line and a second end of the series configuration coupled to a ground potential reference;
      a column decoder that generates the bit line;
      a row decoder that generates a word line having a nominal voltage level; and
      a voltage generator circuit, coupled between the row decoder and the memory array, that adjusts the nominal voltage level in response to the position of a first memory cell indicated by the word line.

13. The system of claim 12 wherein the voltage generator circuit is a voltage divider network.

14. The system of claim 12 wherein the voltage generator circuit is an analog-to-digital converter that uses a plurality of word lines generated by the row decoder to adjust the nominal voltage level.

15. A NAND flash memory device comprising:
   a memory array comprising a plurality of memory cells coupled together in a series configuration, a first end of the series configuration coupled to a bit line and a second end of the series configuration coupled to a ground potential reference; and
   control circuitry, coupled to the memory array, the control circuitry adapted to execute a method for increasing read and erase verification threshold uniformity in a flash memory device, the method comprising reading a first cell of the plurality of cells, determining a position of the first cell with reference to a ground potential in the flash memory device, and generating a reference current in response to the position.

16. The device of claim 15 wherein determining the position of the first accessed cell comprises decoding an input address.

17. The device of claim 15 wherein the control circuitry is further adapted to compare a measured current from the first cell with the reference current and determine a value of the read first cell in response to the comparison.

18. A NAND flash memory device comprising:
   a memory array comprising a plurality of memory cells coupled together in a series configuration, a first end of the series configuration coupled to a bit line and a second end of the series configuration coupled to a ground potential reference; and
   control circuitry, coupled to the memory array, the control circuitry adapted to execute a method for increasing read and erase verification threshold uniformity in a flash memory device, the method comprising reading a first cell of the plurality of cells, determining a position of the first cell with reference to a ground potential in the flash memory device, and generating one of a reference current or voltage in response to the position.

19. The device of claim 18 wherein the control circuitry is further adapted to compare a measured voltage from the first cell with the reference current or voltage and determine a value of the read first cell in response to the comparison.

20. An electronic system comprising:
   a controller circuit that generates memory signals; and
   a flash memory device, coupled to the controller circuit, that operates in response to the memory signals, the device comprising:
      a memory array comprising a plurality of cells coupled together in a plurality of series configurations; and
      a reference generator that generates a measurement reference for each of the plurality of cells based on their locations in each of the plurality of series configurations.

21. The system of claim 20 wherein the reference generator comprises a plurality of memory locations that store a table indicating a reference current for each of the plurality of cells.

22. The system of claim 20 wherein the reference generator comprises a reference generator circuit.

* * * * *